(12) United States Patent
Cai et al.

(10) Patent No.: US 9,332,663 B2
(45) Date of Patent: May 3, 2016

(54) ELECTRONIC DEVICE OPENED BY MAGNETIC FORCE

(71) Applicants: Maintek Computer (Suzhou) Co., Ltd, JiangSu (CN); PEGATRON CORPORATION, Taipei (TW)

(72) Inventors: Qi-Fei Cai, JiangSu (CN); Meng-Chuan Chen, Taipei (TW)

(73) Assignees: Maintek Computer (Suzhou) Co., Ltd, JiangSu (CN); PEGATRON CORPORATION, Taipei (TW)

( * ) Notice: Subject to any disclaimer, the term of this patent is extended or adjusted under 35 U.S.C. 154(b) by 149 days.

(21) Appl. No.: 14/203,577

(22) Filed: Mar. 11, 2014

(65) Prior Publication Data

US 2014/0347813 A1 Nov. 27, 2014

(30) Foreign Application Priority Data

May 23, 2013 (CN) .......................... 2013 1 0196764

(51) Int. Cl.
*G06F 1/16* (2006.01)
*H05K 5/02* (2006.01)

(52) U.S. Cl.
CPC ............ *H05K 5/0221* (2013.01); *G06F 1/1656* (2013.01)

(58) Field of Classification Search
None
See application file for complete search history.

(56) References Cited

U.S. PATENT DOCUMENTS

| 6,151,486 A * | 11/2000 | Holshouser ......... H04M 1/0214 |
| | | 379/433.13 |
| 6,362,868 B1 * | 3/2002 | Silverbrook ......... H04N 5/2628 |
| | | 347/86 |

(Continued)

FOREIGN PATENT DOCUMENTS

| CN | 2554752 Y | 6/2003 |
| CN | 1306137 C | 3/2007 |
| CN | 102740632 A | 10/2012 |

*Primary Examiner* — Hoa C Nguyen
*Assistant Examiner* — Xanthia C Cunningham
(74) *Attorney, Agent, or Firm* — CKC & Partners Co., Ltd.

(57) ABSTRACT

An electronic device opened by magnetic force includes a bottom cover, a top cover, at least one engaging module, a conductive logo, and at least one electromagnet. The top cover is capable of being opened and closed relative to the bottom cover. The top cover has a first engaging portion. The engaging module is disposed at the bottom cover and has a magnetic attraction portion, an elastic element and a second engaging portion. When the conductive logo is electrified, the electromagnet generates magnetism for attracting the magnetic attraction portion to drive the second engaging portion to be separated from the first engaging portion thus deforming the elastic element to allow the top cover to be opened. When the conductive logo is stopped from being electrified, the elastic element is restored to allow the second engaging portion to return to the original position.

10 Claims, 6 Drawing Sheets

(56) References Cited

U.S. PATENT DOCUMENTS

| | | | | |
|---|---|---|---|---|
| 6,517,129 | B1* | 2/2003 | Chien | E05B 63/248 292/121 |
| 7,405,927 | B2* | 7/2008 | Lev | E05C 19/163 292/121 |
| 7,407,202 | B2* | 8/2008 | Ye | E05B 63/248 292/121 |
| 7,583,500 | B2* | 9/2009 | Ligtenberg | G06F 1/1616 361/147 |
| 7,661,732 | B2* | 2/2010 | Hsu | H04M 1/0245 292/251.5 |
| 7,775,567 | B2* | 8/2010 | Ligtenberg | E05C 19/16 292/251.5 |
| 7,852,621 | B2* | 12/2010 | Lin | G06F 1/1616 24/303 |
| 8,009,424 | B2* | 8/2011 | Zhu | E05B 15/101 292/251.5 |
| 8,085,533 | B2* | 12/2011 | Zhao | E05B 65/006 292/251.5 |
| 8,346,321 | B2* | 1/2013 | Huang | G06F 1/1616 455/575.4 |
| 8,534,933 | B2* | 9/2013 | Sherwood | F16M 11/041 396/348 |
| 8,587,396 | B2* | 11/2013 | Liang | G06F 1/1633 335/205 |
| 8,729,987 | B2* | 5/2014 | Chen | G06F 1/1677 335/205 |
| 8,749,971 | B2* | 6/2014 | Liang | G06F 1/1616 292/251.5 |
| 8,841,981 | B2* | 9/2014 | Fullerton | E05C 19/16 335/306 |
| 8,861,199 | B2* | 10/2014 | Liang | G06F 1/1616 292/251.5 |
| 8,889,985 | B2* | 11/2014 | Shi | H04M 1/0216 174/50 |
| 2004/0189017 | A1* | 9/2004 | Chen | E05B 63/248 292/251.5 |
| 2006/0038415 | A1* | 2/2006 | Liu | E05C 3/162 292/251.5 |
| 2006/0089550 | A1* | 4/2006 | Kitney | G01R 33/30 600/410 |
| 2007/0159033 | A1* | 7/2007 | McBroom | G06F 1/16 312/223.2 |
| 2008/0061565 | A1* | 3/2008 | Lee | E05C 19/16 292/251.5 |
| 2008/0136197 | A1* | 6/2008 | Lin | E05C 19/16 292/251.5 |
| 2008/0146295 | A1* | 6/2008 | Jorgensen | H01F 7/0263 455/575.3 |
| 2008/0179895 | A1* | 7/2008 | Lin | E05B 47/004 292/116 |
| 2008/0179897 | A1* | 7/2008 | Wu | G06F 1/1616 292/251.5 |
| 2008/0218953 | A1* | 9/2008 | Yun | E05B 47/004 361/679.57 |
| 2010/0176698 | A1* | 7/2010 | Wu | G06F 1/1616 312/223.1 |
| 2010/0281933 | A1* | 11/2010 | Barrieau | E05C 17/56 70/263 |
| 2010/0283270 | A1* | 11/2010 | Hood, III | E05B 17/0033 292/251.5 |
| 2010/0321253 | A1* | 12/2010 | Ayala Vazquez | H01Q 1/2258 343/702 |
| 2011/0012846 | A1* | 1/2011 | Zhu | G06F 1/1624 345/173 |
| 2011/0292618 | A1* | 12/2011 | Naukkarinen | G06F 1/1632 361/729 |
| 2012/0069503 | A1* | 3/2012 | Lauder | G06F 1/1626 361/679.01 |
| 2013/0038988 | A1* | 2/2013 | Chen | G06F 1/1677 361/679.01 |

* cited by examiner

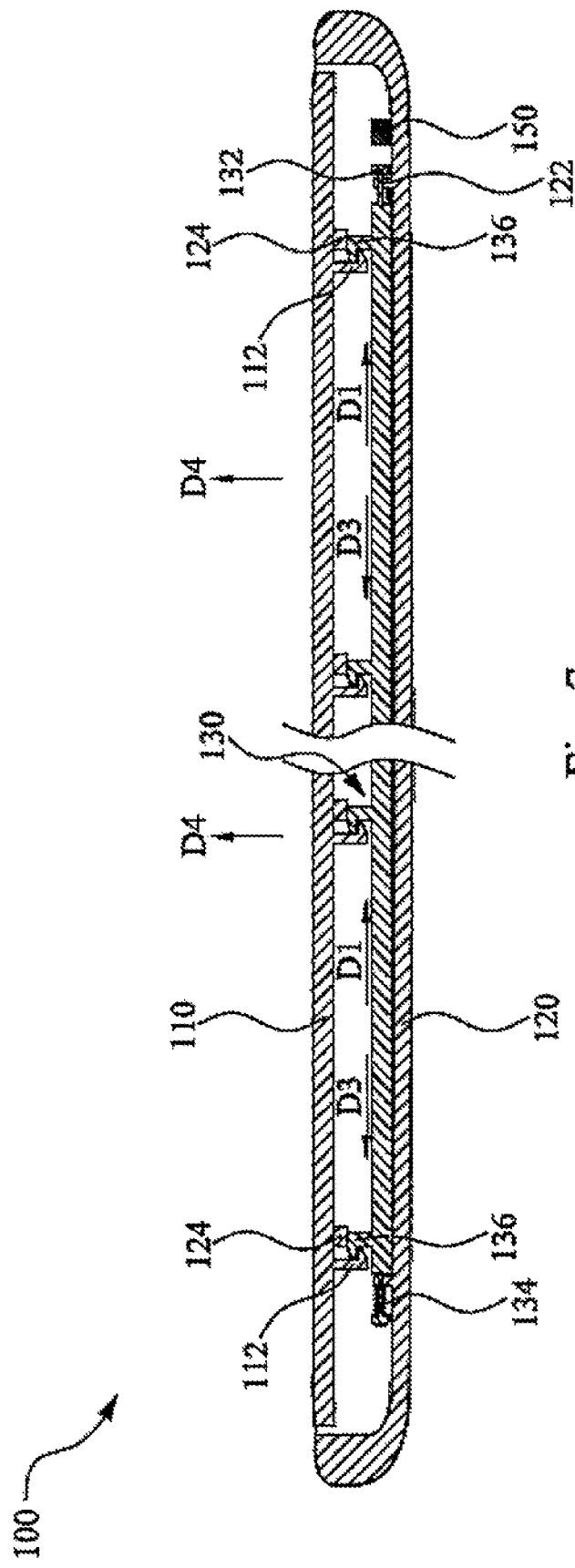

ELECTRONIC DEVICE OPENED BY MAGNETIC FORCE

CROSS-REFERENCE TO RELATED APPLICATIONS

This Non-provisional application claims priority under 35 U.S.C. §119(a) on Patent Application No(s). 201310196764.8 filed in People's Republic of China on May 23, 2013, the entire contents of which are hereby incorporated by reference.

BACKGROUND OF THE INVENTION

1. Field of the Invention

This invention relates to an electronic device and, more particularly, to an electronic device opened by magnetic force.

2. Description of the Related Art

In general, an electronic device, such as a mobile phone, a PDA, or a notebook, has a case assembled by a top cover and a bottom cover. The case can cover electronic components disposed inside the electronic device to avoid the electronic components from damage caused by impact.

The top cover and the bottom cover of the conventional electronic device can be combined using screws and hooks. When the top cover and the bottom cover are fixed by the screws, the surfaces of the top cover and the bottom cover of such the electronic device need screw holes thus to deteriorate the aesthetics even though it is convenient for a user to disassemble. When the top cover and the bottom cover are fixed by the hooks, such the top cover and the bottom cover have no screw holes, and the aesthetics of the electronic device is improved. However, an inactive hook (such as a hook lacking elasticity or rigidly combined) is easily broken by external force even though it has high strength when the electronic device fixed by the hook is disassembled. As to a living hook (such as a hook having elasticity or easily loosed), its strength is insufficient even though it is convenient for disassembling and maintaining.

In addition, although the top cover and the bottom cover can be fixed by both the screws and the hooks, the case still has the screw holes and the manufacturing cost is increased due to a relatively complicated structure.

BRIEF SUMMARY OF THE INVENTION

An object of the present invention is to provide an electronic device opened by magnetic force having better aesthetics, better strength and capable of being disassembled easily.

The electronic device opened by magnetic force of the present invention includes a bottom cover, a top cover, at least one engaging module, a conductive logo, and at least one electromagnet. The top cover is connected to the bottom cover and is capable of being opened and closed relative to the bottom cover. The top cover has a first engaging portion. The engaging module is disposed at the bottom cover and has a magnetic attraction portion, an elastic element, and a second engaging portion. One end of the elastic element is fixed at the bottom cover and the other end is connected to the magnetic attraction portion. The second engaging portion is connected to the magnetic attraction portion. When the top cover covers the bottom cover, the second engaging portion is engaged with the first engaging portion. The electromagnet is disposed at the bottom cover and electrically connected to the conductive logo. The electromagnet is disposed facing to the magnetic attraction portion with an interval. When the conductive logo is electrified, the electromagnet generates magnetism for attracting the magnetic attraction portion to drive the second engaging portion to be separated from the first engaging portion thus deforming the elastic element thus to allow the top cover to be opened. When the conductive logo is stopped from being electrified, the elastic element is restored to allow the second engaging portion to return to the original position.

In an embodiment of the present invention, the bottom cover may have a sliding slot and the magnetic attraction portion may be slidably disposed in the sliding slot.

In an embodiment of the present invention, the second engaging portion may disposed between the elastic member and the magnetic attraction portion.

In an embodiment of the present invention, the magnetic attraction portion may be magnet or metal.

In an embodiment of the present invention, the amount of the engaging module and the electromagnet may be plural. A plurality of engaging modules may be disposed surrounding the bottom cover, and a plurality of electromagnets may also be correspondingly disposed surrounding the bottom cover.

In an embodiment of the present invention, the conductive logo may be disposed on a surface of the bottom cover back to the top cover and have two contacts inserted into the bottom cover and exposed to a surface of the bottom cover facing to the top cover.

In an embodiment of the present invention, the electronic device may further include a cable set connected to the electromagnet and the two contacts.

In an embodiment of the present invention, the bottom cover may further include a block. When the second engaging portion is engaged with the first engaging portion, the block may be against a top surface of the second engaging portion.

In an embodiment of the present invention, the elastic element may include a spring.

In an embodiment of the present invention, the electronic device may be a tablet computer.

In the present invention, the engaging module has the magnetic attraction portion and the elastic element, and the electromagnet electrically connected to the conductive logo is disposed facing to the magnetic attraction portion. Accordingly, when the conductive logo is electrified, the electromagnet can generate the magnetism for attracting the magnetic attraction portion to drive the second engaging portion of the engaging module to be separated from the first engaging portion of the top cover thus deforming the elastic element to allow the top cover to be opened relative to the bottom cover. In addition, when the conductive logo is stopped from being electrified, the elastic element of the engaging module can utilize an elastic restoring force thereof to allow the second engaging portion to return to the original position so that the second engaging portion can be engaged with the first engaging portion.

Therefore, the top cover and the bottom cover do not need screw holes so that the electronic device has better aesthetics. In addition, the magnetic attraction portion can be attracted by the electromagnet to move so that the second engaging portion of the engaging module and the first engaging portion of the top cover can be designed to be an inactive engagement to allow the top cover and the bottom cover to have as better strength after assembling. Moreover, when the conductive logo is electrified, the top cover and the bottom cover can be separated thus facilitating disassembling the top cover for maintaining for facilitating maintenance staff.

BRIEF DESCRIPTION OF THE DRAWINGS

FIG. 7 is a cross-sectional view showing the top cover of the electronic device of FIG. 6 after being assembled to the bottom cover.

DETAILED DESCRIPTION OF THE INVENTION

Figure 1:
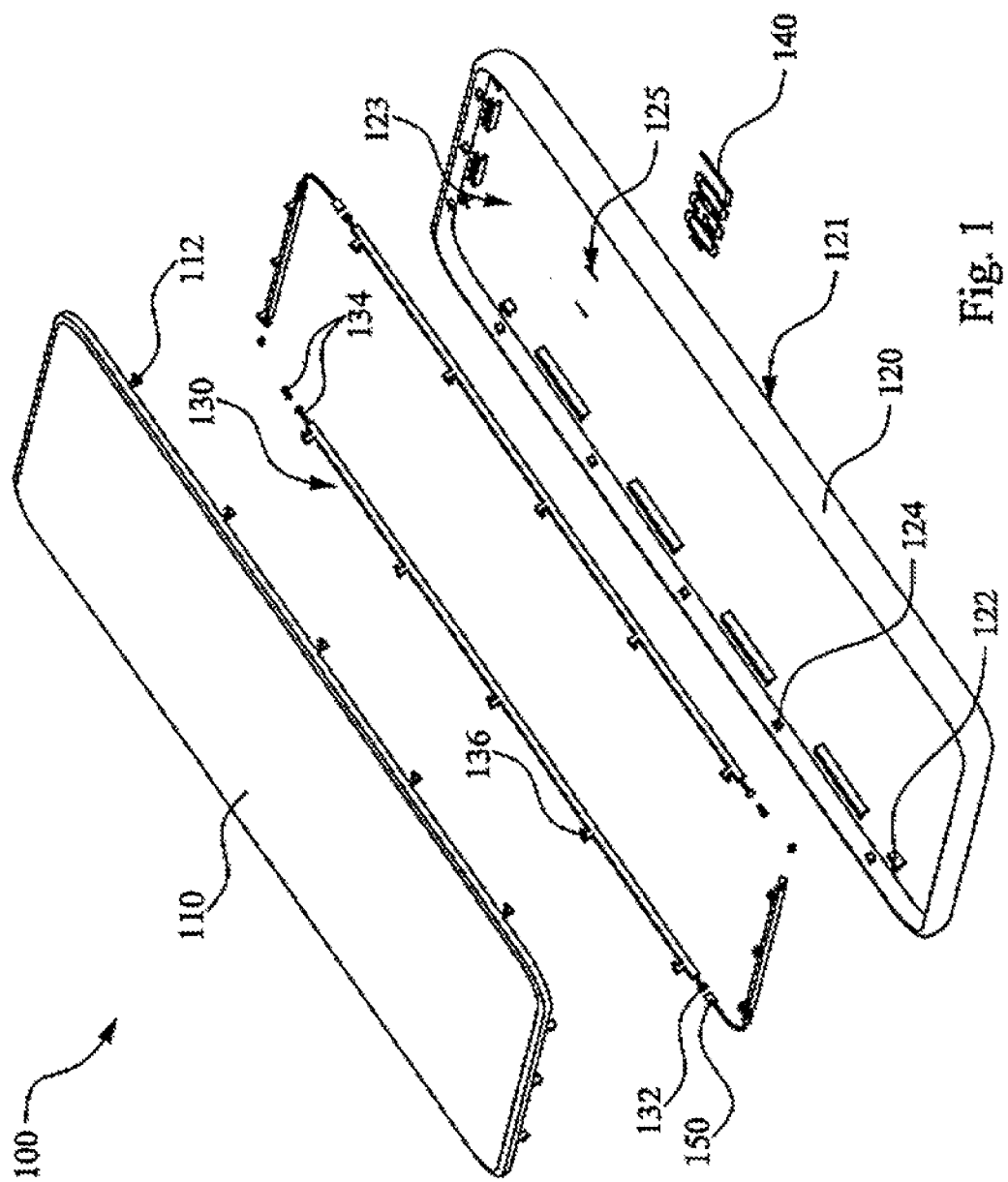
FIG. 1 is an exploded view showing an electronic device of a first embodiment according to the present invention.

The following drawings disclose various embodiments of the present invention, and in order to clearly illustrate, many practical details are provided in the following description and instructions. However, it should be understood that these details are not used to limit the invention. That is, in some embodiments of the present invention, the practical details are not necessary. In addition, to simplify the drawing, some of the known conventional structures and components may be illustrated in the drawings in a schematic way.

FIG. 1 is an exploded view showing an electronic device 100 of a first embodiment according to the present invention. As shown in the figure, the electronic device 100 includes a top cover 110, a bottom cover 120, an engaging module 130, a conductive logo 140, and an electromagnet 140. The top cover 110 is connected to the bottom cover 120 and is capable of being opened and closed relative to the bottom cover 120. In this embodiment, the engaging module 130 and the electromagnet 150 are plural. A plurality of engaging modules 130 are disposed surrounding the bottom cover 120, and a plurality of electromagnets 150 are also correspondingly disposed surrounding the bottom cover 120. The electronic device 100 can be a tablet computer, a personal digital assistant (PDA), or a mobile phone. However, the present invention is not limited thereto.

Figure 2:
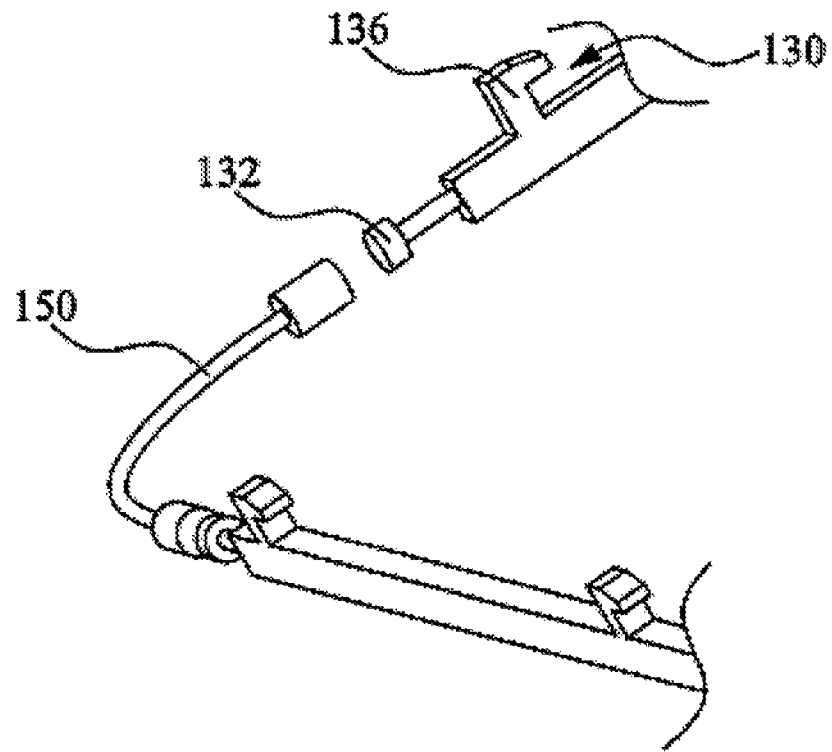
FIG. 2 is a partial enlarged view showing an engaging module and an electromagnet of FIG. 1.

FIG. 2 is a partial enlarged view showing an engaging module 130 and an electromagnet 150 of FIG. 1. Please refer to FIG. 1 and FIG. 2 simultaneously. The top cover 110 has a first engaging portion 112. The engaging module 130 has a magnetic attraction portion 132, an elastic element 134, and a second engaging portion 136. The engaging module 130 may be disposed at the bottom cover 120. The second engaging portion 136 is connected to the magnetic attraction portion 132. When the top over 110 covers the bottom cover 120, the second engaging portion 136 and the first engaging portion 112 can be engaged with each other.

In this embodiment, the bottom cover 120 has a sliding slot 122, and the magnetic attraction portion 132 is slidably disposed in the sliding slot 122. The second engaging portion 136 is disposed between the elastic element 134 and the magnetic attraction portion 132. In addition, the magnetic attraction portion 132 can be magnet or metal. However, the present invention is not limited thereto. For example, the magnetic attraction portion 132 can be made of any material so long as the magnetic attraction portion 132 can be attracted by the electromagnet 150 when the electromagnet 150 is electrified.

Figure 3:
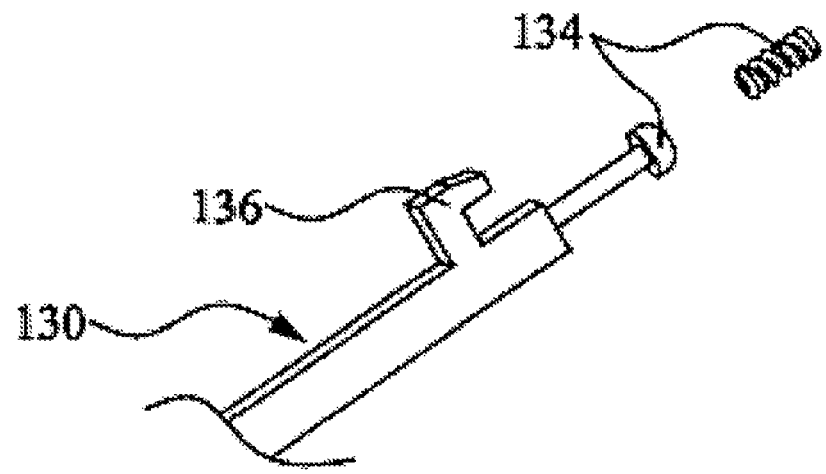
FIG. 3 is a partial enlarged view showing an elastic element of the engaging module of FIG. 1.

FIG. 3 is a partial enlarged view showing an elastic element 134 of the engaging module 130 of FIG. 1. Please refer to FIG. 1 and FIG. 3 simultaneously. One end of the elastic element 134 can be fixed at the bottom cover 120 and the other end can be connected to the magnetic attraction portion 132. The elastic element 134 can include a spring or other elements having elasticity (such as a rubber pad). In this embodiment, two ends of the engaging module 130 are the elastic element 134 and the magnetic attraction portion 132, respectively, and the elastic element 134 is disposed at one end of the engaging module 130 far away from the electromagnet 150.

Figure 4:
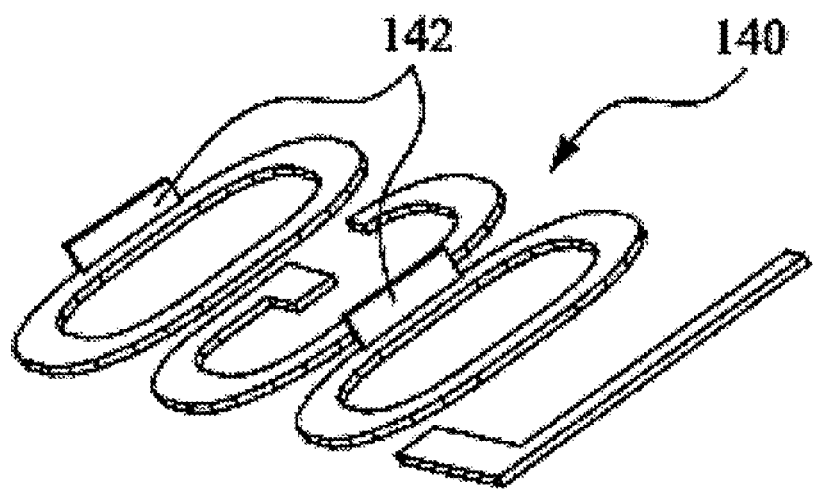
FIG. 4 is a partial enlarged view showing a conductive logo of FIG. 1.

FIG. 4 is a partial enlarged view showing a conductive logo 140 of FIG. 1. Please refer to FIG. 1 and FIG. 4 simultaneously. The conductive logo 140 can be disposed on a surface 121 of the bottom cover 120 back to the top cover 110 and have two electrically conductive contacts 142. The bottom cover 120 has two openings 125. In assembling, the contacts 142 can be inserted into the openings 125, and the electromagnet 150 is disposed at the bottom cover 120. Further, the contacts 142 are exposed to a surface 123 of the bottom cover 120 facing to the top cover 110.

Figure 5:
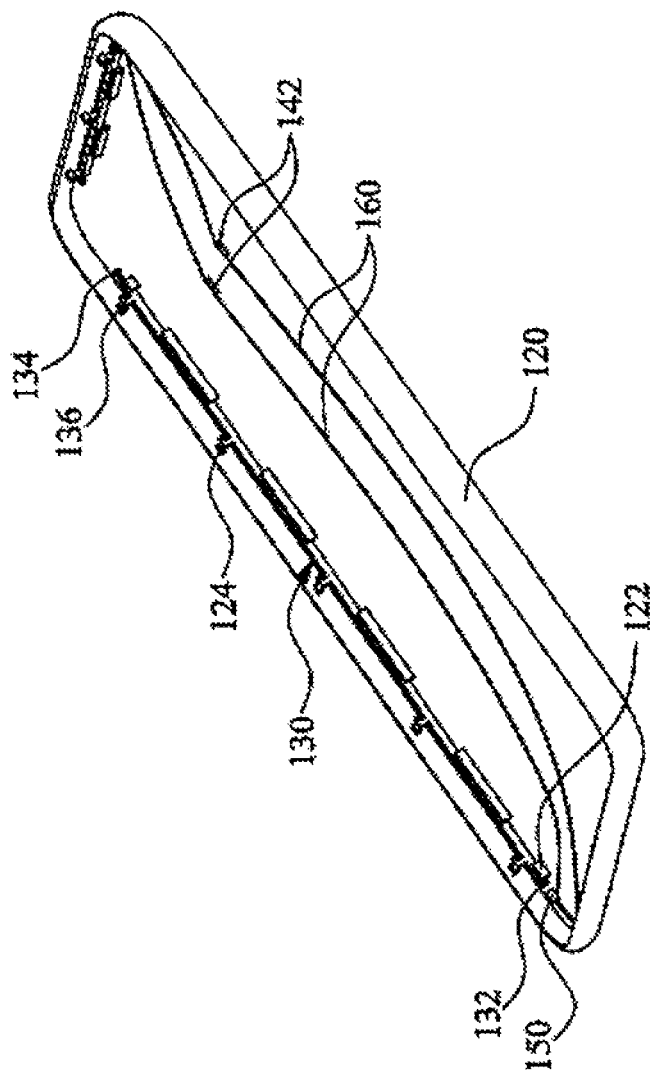
FIG. 5 is a perspective view showing the engaging module and the conductive logo of FIG. 1 after being assembled to the bottom cover.

FIG. 5 is a perspective view showing the engaging module 130 and the conductive logo 140 (please refer to FIG. 4) of FIG. 1 after being assembled to the bottom cover 120. Please refer to FIG. 4 and FIG. 5 simultaneously. The electronic device 100 (please refer to FIG. 1) further includes a cable set 160. The cable set 160 is connected to the electromagnet 150 and the two contacts 142 of the conductive logo 140 to allow the electromagnet 150 to be electrically connected to the conductive logo 140 through the cable set 160. Accordingly, when the conductive logo 140 is electrified, the cable set 160 is capable of transmitting the current to the electromagnet 150 to allow the electromagnet 150 to generate the magnetism to attract the magnetic attraction portion 132 of the engaging module 130.

The operation of assembling the top cover 110 onto the bottom cover 120 and the action of the engaging module 130 after the conductive logo 140 is electrified are described as follows. In addition, the described connection relation of the elements and materials may not be described repeatedly.

Figure 6:
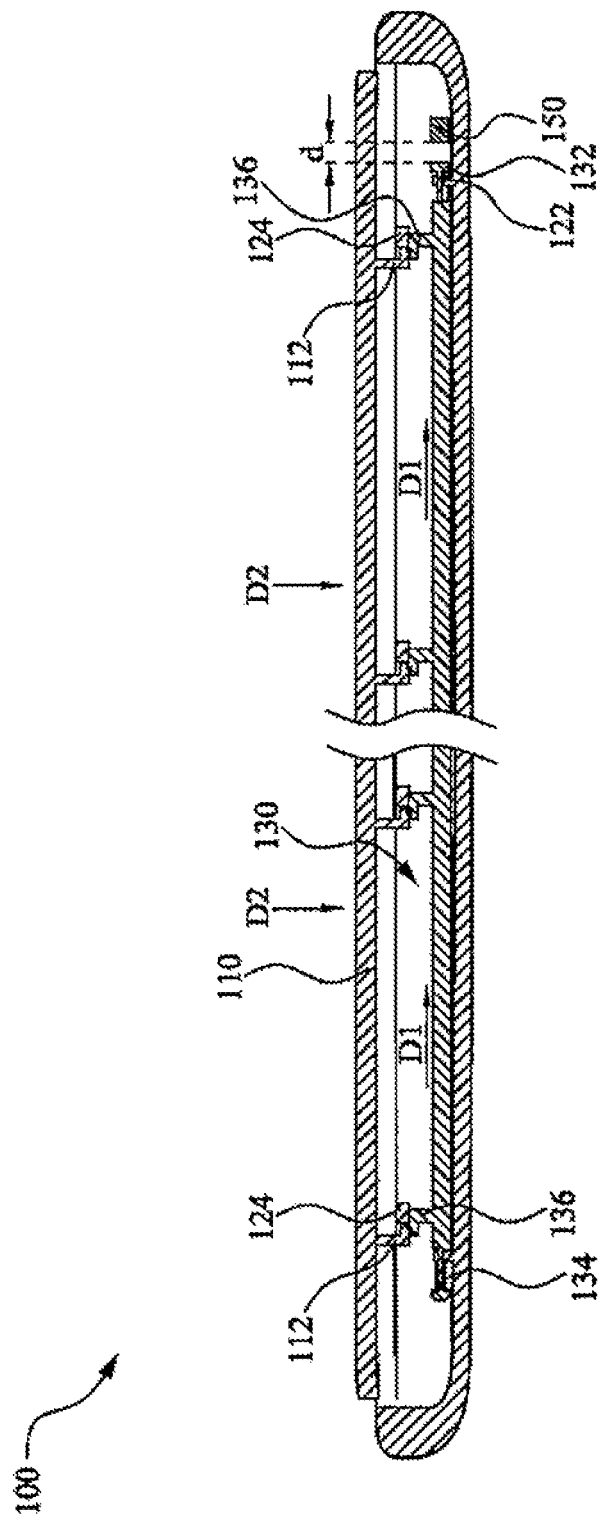
FIG. 6 is a cross-sectional view showing the top cover of the electronic device of FIG. 1 before being assembled to the bottom cover.

FIG. 6 is a cross-sectional view showing the top cover 110 of the electronic device 100 of FIG. 1 before being assembled to the bottom cover 120. Please refer to FIG. 5 and FIG. 6 simultaneously. The electromagnet 150 is disposed facing to the magnetic attraction portion 132 with an interval d. In assembling the top cover 110 with the bottom cover 120, the first engaging portion 112 of the top cover 110 can be placed on the second engaging portion 136 of the engaging module 130 first. At this time the first engaging portion 112 and the second engaging portion 136 are not engaged with each other. Then, the user can slightly apply force to press the top cover 110 or the bottom cover 120 to allow the first engaging portion 112 to go over the top surface of the second engaging portion 136 to be engaged with the second engaging portion 136. However, the present invention is not limited thereto.

In other embodiments, when the top cover 110 is assembled with the bottom cover 120, the conductive logo 140 (please refer to FIG. 4) can be electrified, so that the current may be transmitted to the electromagnet 150 through the contacts 142 and the cable set 160. At this time, the electromagnet 150 generates the magnetism to attract the magnetic attraction portion 132 to move towards a direction D1 so that the whole engaging module 130 may move towards the direction D1 and the elastic element 134 is elastically deformed. Accordingly, the first engaging portion 112 lacks the support of the second engaging portion 136, and therefore the top cover 110 can move towards a direction D2 easily by gravity itself. Then, the conductive logo 140 is further stopped from being electrified to allow the attraction between the magnetic attraction portion 132 of the engaging module 130 and the electromagnet 150 to disappear. The engaging module 130 can return to the original position by the elastic restoring force of the elastic element 134 thus to allow the first engaging portion 112 and the second engaging portion 136 to be engaged with each other.

FIG. 7 is a cross-sectional view showing the top cover 110 of the electronic device 100 of FIG. 1 after being assembled to the bottom cover 120. Please refer to FIG. 6 and FIG. 7 simultaneously. The bottom cover 120 further includes a block 124. When the second engaging portion 136 is engaged with the first engaging portion 112, the block 124 is against the top surface of the second engaging portion 136 to prevent the engaging module 130 from being separated from the sliding slot 122.

Please refer to FIG. 7. When the first engaging portion 112 of the top cover 110 is engaged with the second engaging portion 136 of the bottom cover 120, the conductive logo 140 (please refer to FIG. 4) can be electrified if opening the top cover 110 is necessary for such as maintaining the electronic device 100 or exchanging the components therein. At this time, the electromagnet 150 of the engaging module 130 may generate the magnetism to attract the magnetic attraction portion 132 to move towards the direction D1 relative to the bottom cover 120. Also, the second engaging portion 136 is driven to move towards the direction D1 to be separated from the first engaging portion 112 of the top cover 110 so that the maintenance staff can open the top cover 110 along a direction D4. When the magnetic attraction portion 132 moves towards the direction D1 relative to the bottom cover 120, the elastic element 134 is pulled thus to store elastic potential energy. When the conductive logo 140 (please refer to FIG. 4) is stopped from being electrified, the elastic element 134 can utilize the elastic potential energy stored by itself to allow the second engaging portion 136 to return to the original position towards a direction D3.

Compared with the case of the conventional electronic device, the top cover 110 and the bottom cover 120 of the electronic device 100 according to the preferred embodiments of the present invention do not need the screw holes so that the electronic device 100 has better aesthetics. In addition, the magnetic attraction portion 132 can be attracted by the electromagnet 150 to move so that the second engaging portion 136 of the engaging module 130 and the first engaging portion 112 of the top cover 110 can be designed to be an inactive engagement to allow the top cover 110 and the bottom cover 120 to have a better strength after assembling. Moreover, when the conductive logo 140 is electrified, the top cover 110 can be separated from the bottom cover 120 thus facilitating disassembling the top cover 110 to maintain the components inside the electronic device 100 for maintenance staff. Further, the conductive logo 140 can be used as an electrically conductive electrode to be connected with the components inside the electronic device 100 via the electrical conduction thereof.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An electronic device opened by magnetic force, comprising:
    a bottom cover;
    a top cover connected to the bottom cover and capable of being opened and closed relative to the bottom cover, where in the top cover has a first engaging portion;
    at least one engaging module disposed at the bottom cover and having a magnetic attraction portion, an elastic element, and a second engaging portion, wherein one end of the elastic element is fixed at the bottom cover and the other end is connected to the magnetic attraction portion, the second engaging portion is connected to the magnetic attraction portion, and the second engaging portion is engaged with the first engaging portion when the top cover covers the bottom cover;
    a conductive logo; and
    at least one electromagnet disposed at the bottom cover and electrically connected to the conductive logo, wherein the electromagnet is disposed facing to the magnetic attraction portion with an interval, when the conductive logo is electrified, the electromagnet generates magnetism for attracting the magnetic attraction portion to drive the second engaging portion to be separated from the first engaging portion thus deforming the elastic element to allow the top cover to be opened, and when the conductive logo is stopped from being electrified, the elastic element is restored to allow the second engaging portion to return to the original position.

2. The electronic device opened by magnetic force according to claim 1, wherein the bottom cover has a sliding slot and the magnetic attraction portion is slidably disposed in the sliding slot.

3. The electronic device opened by magnetic force according to claim 1, wherein the second engaging portion is disposed between the elastic member and the magnetic attraction portion.

4. The electronic device opened by magnetic force according to claim 1, wherein the magnetic attraction portion is magnet or metal.

5. The electronic device opened by magnetic force according to claim 1, wherein the amount of the engaging module and the electromagnet are plural, and a plurality of engaging modules are disposed surrounding the bottom cover and a plurality of electromagnets are also correspondingly disposed surrounding the bottom cover.

6. The electronic device opened by magnetic force according to claim 1, wherein the conductive logo is disposed on a surface of the bottom cover back to the top cover and has two contacts inserted into the bottom cover and exposed to a surface of the bottom cover facing to the top cover.

7. The electronic device opened by magnetic force according to claim 6, further comprising a cable set connected to the electromagnet and the two contacts.

8. The electronic device opened by magnetic force according to claim 1, wherein the bottom cover further comprises a block and the block is against a top surface of the second engaging portion when the second engaging portion is engaged with the first engaging portion.

9. The electronic device opened by magnetic force according to claim 1, wherein the elastic element comprises a spring.

10. The electronic device opened by magnetic force according to claim 1, wherein the electronic device is a tablet computer.

* * * * *